(12) United States Patent
Endo et al.

(10) Patent No.: US 7,301,336 B2
(45) Date of Patent: Nov. 27, 2007

(54) MAGNETIC FIELD GENERATOR DEVICE FOR CALIBRATION OF MAGNETIC FORCE MICROSCOPE

(75) Inventors: Yasuhiro Endo, Kawasaki (JP); Shinichi Wakana, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 155 days.

(21) Appl. No.: 11/174,503

(22) Filed: Jul. 6, 2005

(65) Prior Publication Data
US 2006/0139026 A1   Jun. 29, 2006

(30) Foreign Application Priority Data
Dec. 27, 2004 (JP) .............................. 2004-375425

(51) Int. Cl.
*G01R 33/02* (2006.01)
(52) U.S. Cl. ...................................... 324/244; 324/202
(58) Field of Classification Search ................ 324/244, 324/260, 202; 250/306, 307, 311
See application file for complete search history.

(56) References Cited

U.S. PATENT DOCUMENTS

| | | | | |
|---|---|---|---|---|
| 5,493,216 A | * | 2/1996 | Asa | .......................... 324/207.2 |
| 5,523,679 A | * | 6/1996 | Kalb | ........................... 324/165 |
| 5,623,205 A | | 4/1997 | Tomita et al. | |
| 5,757,180 A | * | 5/1998 | Chou et al. | ............... 324/207.2 |
| 6,175,233 B1 | * | 1/2001 | McCurley et al. | ........ 324/207.2 |
| 6,201,389 B1 | * | 3/2001 | Apel et al. | ................ 324/207.2 |
| 6,476,600 B2 | * | 11/2002 | Kono et al. | .............. 324/207.2 |
| 6,486,654 B1 | | 11/2002 | Hug et al. | |
| 6,605,941 B2 | | 8/2003 | Abe | |
| 6,650,109 B1 | * | 11/2003 | Reichl et al. | ............. 324/207.2 |
| 6,700,367 B1 | * | 3/2004 | Santos et al. | ................ 324/165 |
| 7,166,996 B2 | * | 1/2007 | Godkin | .................. 324/207.24 |

FOREIGN PATENT DOCUMENTS

| | | |
|---|---|---|
| EP | 957333 | 11/1999 |
| JP | 7-72229 | 3/1995 |
| JP | 11-304822 | 11/1999 |
| JP | 2000-346780 | 12/2000 |
| JP | 2001-266317 | 9/2001 |

OTHER PUBLICATIONS

"The Digital Instruments Dimension 3100 Scanning Probe Microscope (SPM)", 2004, www.veeco.com/html/datasheet_d3100.asp, Printed on Sep. 17, 2004, 5 pages.

* cited by examiner

*Primary Examiner*—Jay M Patidar
(74) *Attorney, Agent, or Firm*—Stass & Halsey LLP (57) ABSTRACT

The magnetic field generator device comprises a plurality of magnetic field generator units, which generate distinct magnetic fields in different locations, and at least two or more of these magnetic field generator units have different external shape, configuration or size. The magnetic field formed by such a magnetic field generator device is scanned by the probe device of a magnetic force microscope, and based on the measurement result, the probe device is calibrated.

9 Claims, 13 Drawing Sheets

MAGNETIC FIELD GENERATOR DEVICE FOR CALIBRATION OF MAGNETIC FORCE MICROSCOPE

BACKGROUND OF THE INVENTION

1. Field of the Invention

The present invention relates to a magnetic field generator for a magnetic force microscope, which measures magnetic force.

2. Description of the Related Art

In recent years, magnetic force microscopes, which enable the measurement of magnetic storage media magnetized in a very dense state and magnetization patterns of magnetic samples, have come into practical use (for example, see the following document; "The Digital Instruments Dimension 3100 Scanning Probe Microscope (SPM)" Retrieved Sep. 17, 2004, from http://www.veeco.com/html/datasheet_d3100.asp). The magnetic force microscope is one type of scanning force microscope, which makes non-contact measurements of a physical quantity. By bringing its cantilever, comprising a probe unit consisting of ferromagnetic material and a lever unit, into close proximity with the sample the magnetic force microscope measures the magnetic force generated between the surface of an object to be measured and the probe unit.

When scanned in the non-contact state by slightly separating the probe from the surface of the object to be measured, a magnetic force is generated between the object and the probe, and flexure is generated in the lever unit, which holds the probe. The magnetic field distribution can be measured by detecting the flexure using an optical lever method and by mapping the measured magnetic force in every position.

Cantilever probes for the atomic force microscope, which form the prototype of the magnetic force microscope, have individual variations in characteristics, and therefore sensitivity calibration of the probe is required before measurement. A common method of calibration is to determine the frequency characteristics of a probe by oscillating the probe by mechanical means so that the optimal oscillation amplitude in response to both the oscillation intensity and frequency can be determined.

Magnetic force microscopes also have individual variations in the magnetic characteristics of the cantilever probe, however means for calibrating this variation are not in practical use. The present situation, therefore, is that it is ultimately the frequency characteristic calibration method, of the same kind as that of the atomic force microscope that is used in the magnetic force microscope, and therefore individual variations in the magnetic characteristics of the probes cannot be calibrated.

In light of such a situation, a calibration method of measuring the oscillation frequency fluctuation by applying a direct-current magnetic field to a probe in a state of mechanical oscillation has been proposed (Japanese unexamined patent publication bulletin No. 07-072229, for example).

A magnetic recording head measurement device, which measures the magnetic force of the object to be measured using the magnetic force microscope, by generating a high-frequency magnetic field in the recording head is also widely known (Japanese unexamined patent publication bulletin No. 2001-266317, for example).

As explained above, cantilever probes for magnetic force microscopes have individual characteristics such as variations in the film thickness of the magnetic material used for the probe and probe tip shape. Such a situation causes variations in the measured distance as well as variations in the detected magnetic field intensity however the methods currently in practice cannot be used to compensate for these variations. Even the method of mechanically oscillating the probe cannot be used to correct the measurement distance.

SUMMARY OF THE INVENTION

It is an object of the present invention to calibrate the sensitivity of the cantilever probe of the magnetic force microscope.

The magnetic field generator device of the present invention is a device used for calibration of the magnetic force microscope, and comprises a plurality of magnetic field generator units, which generate distinct magnetic fields in different locations. At least two or more of these magnetic field generator units are different in any one of external shape, configuration and size.

The magnetic force microscope of the present invention comprises a probe device, which scans within the magnetic field distribution formed by the above magnetic field generator device and measures the magnetic field intensity distribution and a processing device, which calibrates the probe device using the measurement result of the scan.

DESCRIPTION OF THE PREFERRED EMBODIMENT

In the following description, details of the preferred embodiment of the present invention are set forth with reference to drawings.

Figure 1:
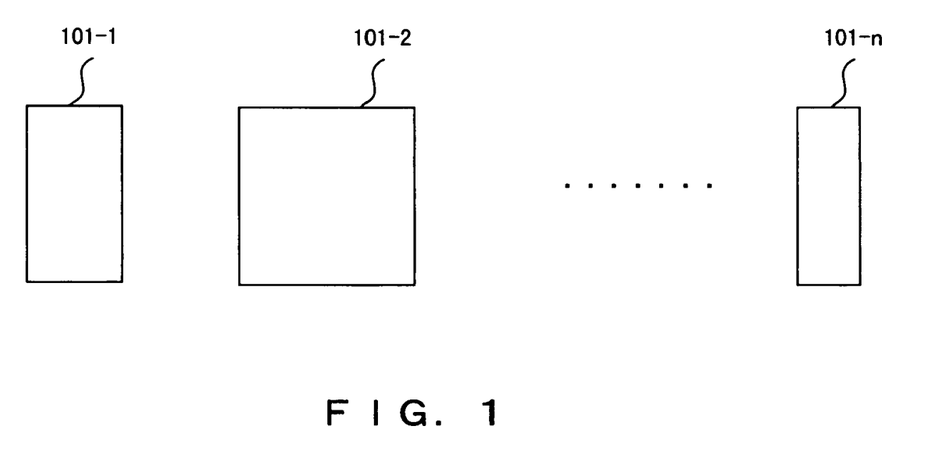
FIG. 1 describes the principle of the magnetic field generator device of the present invention.

FIG. 1 describes the principle of the magnetic field generator device of the present invention. The magnetic field generator in FIG. 1 is a device for calibrating a magnetic force microscope, comprising a plurality of magnetic field generator units 101-$i$ ($i=1, 2, \ldots, n$), which generate distinct magnetic fields in different locations. At least two or more of these magnetic field generator units are different in any one of external shape, configuration and size.

When such a magnetic field generator device is scanned and its magnetic field intensity is measured by a magnetic force microscope, a distance measurement, which corresponds to any one of the external shape, configuration and size of each magnetic field generator unit in the scanning direction can be obtained. Using the measurement, individual variations relating to the measured distance by a probe can be calibrated accurately.

According to the present invention, absolute intensity and measured distance of the probe of the magnetic force microscope can be calibrated. The magnetic field intensity output and absolute value of the measured distance of the device itself can be assured, and thus reproducibility and reliability of the device can be improved. As such, sample inspection accuracy of a magnetic head can also be improved, leading to higher product yield and lower production costs.

The magnetic field generator device of the illustrated embodiment comprises a plurality of the magnetic field generator units, and using these magnetic field generator units, intensity sensitivity calibration and measured distance calibration of a cantilever probe of the magnetic force microscope can be performed. Among the plurality of the magnetic field generator units, at least two or more units are different in any one of their external shape, configuration and size, and this feature allows generation of an arbitrary alternating-current magnetic field. By scanning these magnetic field generator units using a cantilever probe, measurement of intensity and distance based on the differences in the magnetic field generators can be obtained, and the individual differences in probes can be calibrated accurately using differences in the measured values. Absolute intensity and distance measured by the probe of a magnetic field can be accurately calibrated when the cantilever probe is changed.

Figure 2:
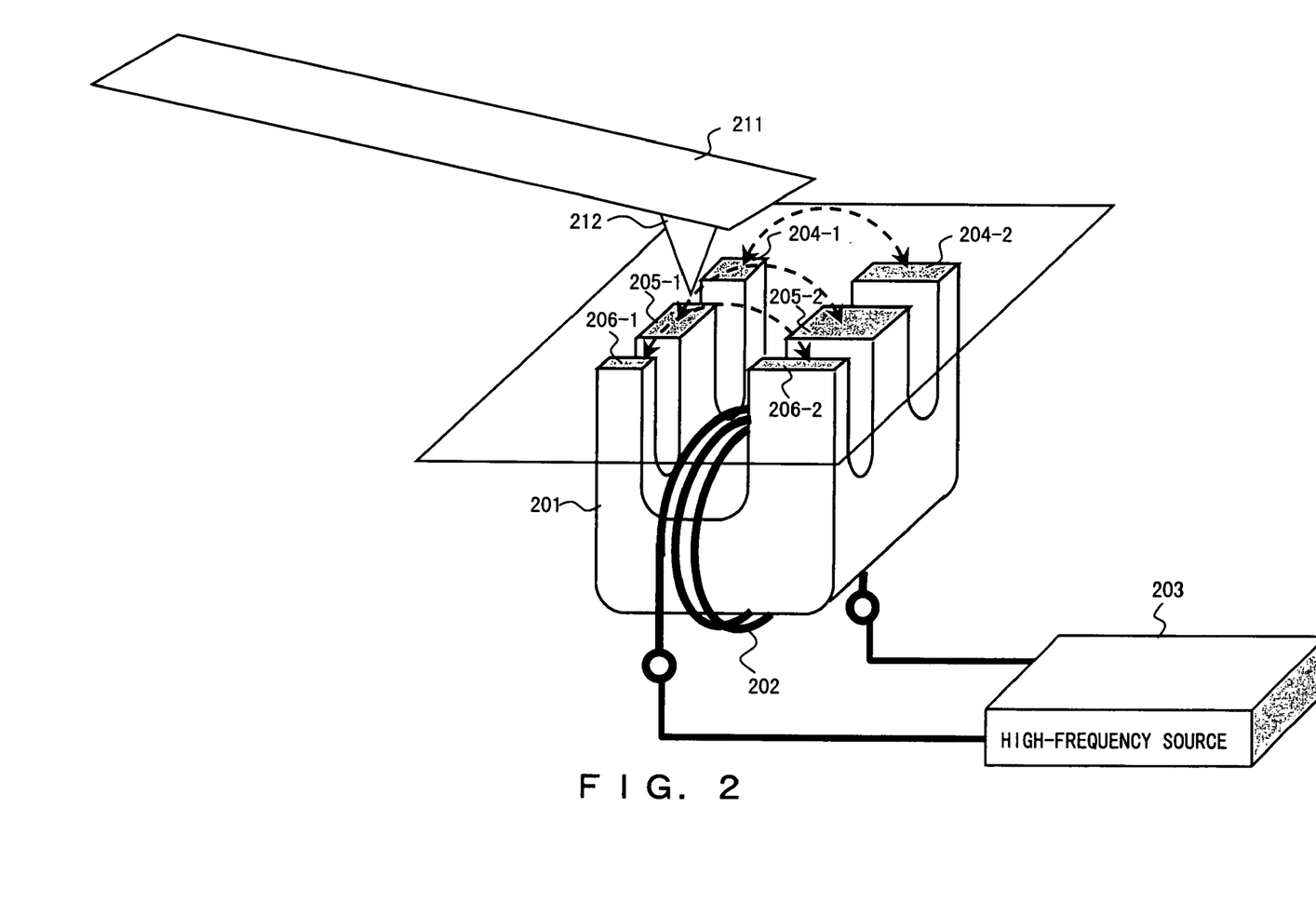
FIG. 2 shows the configuration of a first magnetic field generator device.

FIG. 2 shows the configuration of the magnetic field generator device described above. The magnetic field generator device in FIG. 2 comprises a core 201, a high-frequency driving coil 202 and a high-frequency source 203. The core 201 is configured such that six magnetic pole regions are formed 204-1, 204-2, 205-1, 205-2, 206-1 and 206-2, and the magnetic pole regions 204-1 and 204-2 constitute the magnetic field generator unit A (magnetic pole pair). In the same way, the magnetic pole regions 205-1 and 205-2 constitute the magnetic field generator unit B, and the magnetic pole regions 206-1 and 206-2 constitute the magnetic field generator unit C. Such a magnetic field generator structure generates distinct local magnetic fields at different locations.

By applying a current to coil 202 using the high-frequency source 203, the magnetic field generator units A through C generate high-frequency magnetic fields with arbitrary intensities. A probe 212 is attached to a cantilever 211, and the intensity of the magnetic field generated by each magnetic field generator unit is measured by the probe 212.

Figure 3:
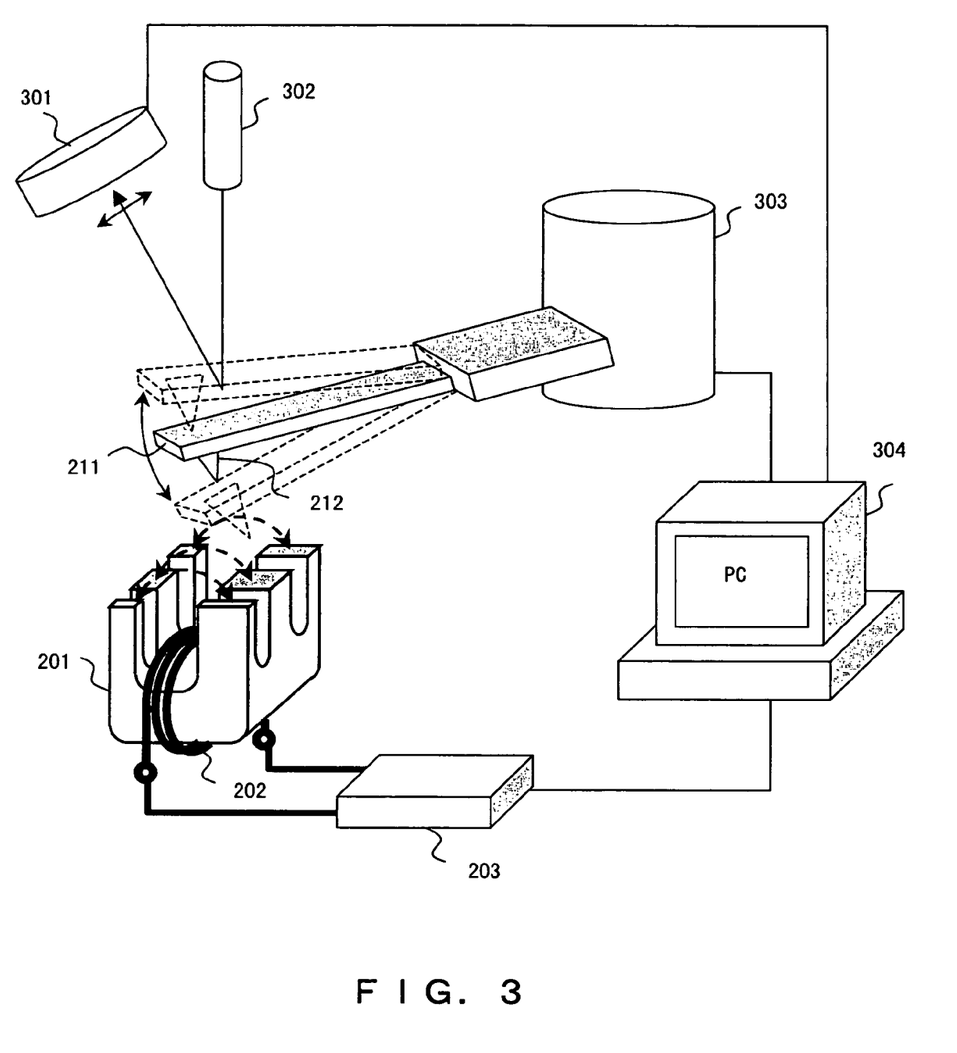
FIG. 3 describes a configuration of calibrator device, which calibrates the probe 212 using the magnetic field generator.

FIG. 3 describes the configuration of the calibration device, which calibrates the probe 212 using the magnetic field generator of FIG. 2. In addition to the magnetic field generator device, the calibrator device in FIG. 3 comprises a magnetic force microscope consisting of a cantilever 211, an optical detector 301, an optical laser source 302, an XYZ scanner 303 and a personal computer (PC) 304.

Figure 4:
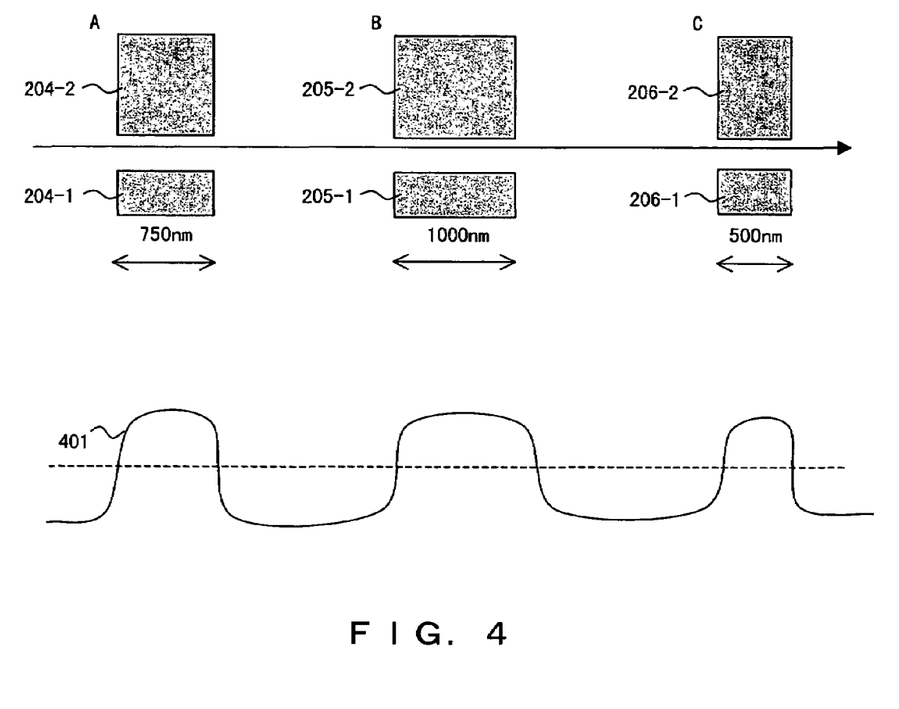
FIG. 4 shows locations of the magnetic field generator units and the line profile.

When the core 201 of the magnetic generator device is viewed from above as shown in FIG. 4, the magnetic field generator configuration of the magnetic generator units A through C forms a line. In this example, the widths of the magnetic pole regions (magnetic pole widths) of the magnetic field generator units A, B and C are designed to be 750 nm, 10000 nm, and 500 nm, respectively.

The PC 304 controls the entire magnetic force microscope and the high-frequency source 203. The high-frequency source 203 drives the coil 202 at the same frequency as the actual sample measurement of the magnetic head, in accordance with the instructions of the PC 304. Here, for example, high-frequency magnetic fields of about 100 MHz are generated, and amplitude modulation is performed using a sinusoidal wave of about 60 kHz, so that the magnetic force microscope can be operated at a high-frequency.

In such a driving state, the XYZ scanner 303, controlled by the PC 304, moves the cantilever 211 so that the probe 212 can scan over the magnetic field generator units A through C of different widths, forming a line. The cantilever 211 is affected by the magnetic field generated by the magnetic field generator units A through C, and starts oscillating with an amplitude in accordance with the magnetic field intensity.

The optical laser output from the optical laser source 302 is reflected by the cantilever 211, and the reflected light is provided to the optical detector 301. The optical detector 301 detects the displacement of the location of the optical input, and outputs the detected displacement as a signal indicating the amplitude of oscillation of the cantilever 211. The optical detector 301 is a PSD (Position Sensitive Detector), for example.

With such an approach, a line profile 401 shown in FIG. 4 is obtained from the amplitude signal output of the optical detector 301 during the scanning operation. The line profile 401 indicates changes in magnetic field intensity as a function of distance in the scanning direction, and corresponds to the magnetic field intensity distribution of each magnetic pole width of the magnetic field generator configuration.

Figure 5:
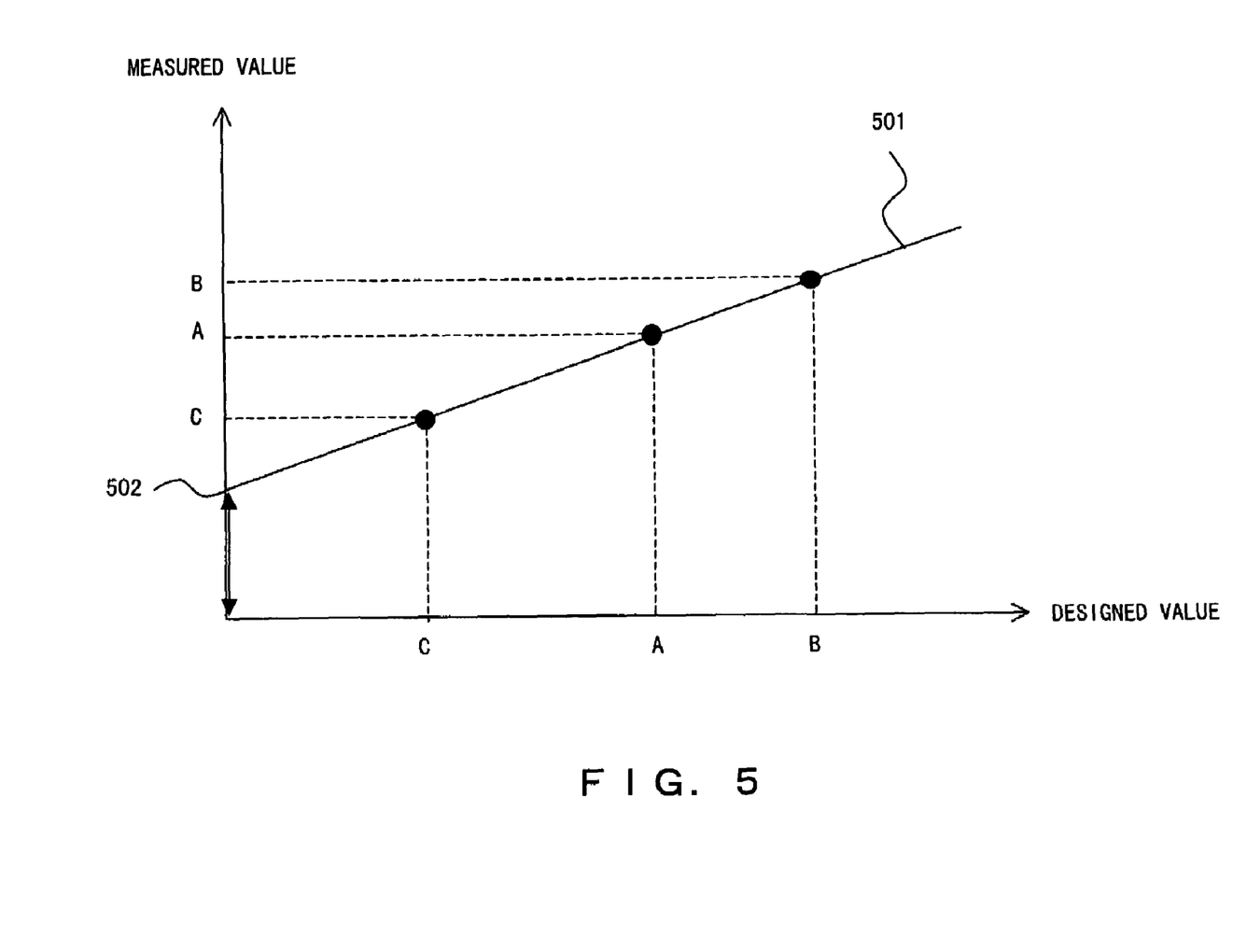
FIG. 5 shows measurement results of magnetic pole width.

The PC 304 calculates the distance corresponding to the magnetic pole width of each magnetic field generator unit from the obtained line profile 401, and plots the calculated distance on a plane with the actual width of the magnetic poles on the horizontal axis and the measured width of the magnetic poles on the vertical axis, as shown in FIG. 5. The intercept 502 and the slope of the line 501 connecting the plotted points is calculated by the method of least squares etc., and the results are stored as characteristic numbers of the probe. These characteristic numbers indicate the characteristics of the individual variations in probes, and by calculating and comparing the characteristic numbers of each probe the individual variations relating to the measured distance of each probe can be calibrated. The intercept 502 alone can be used as the characteristic number.

Figure 6:
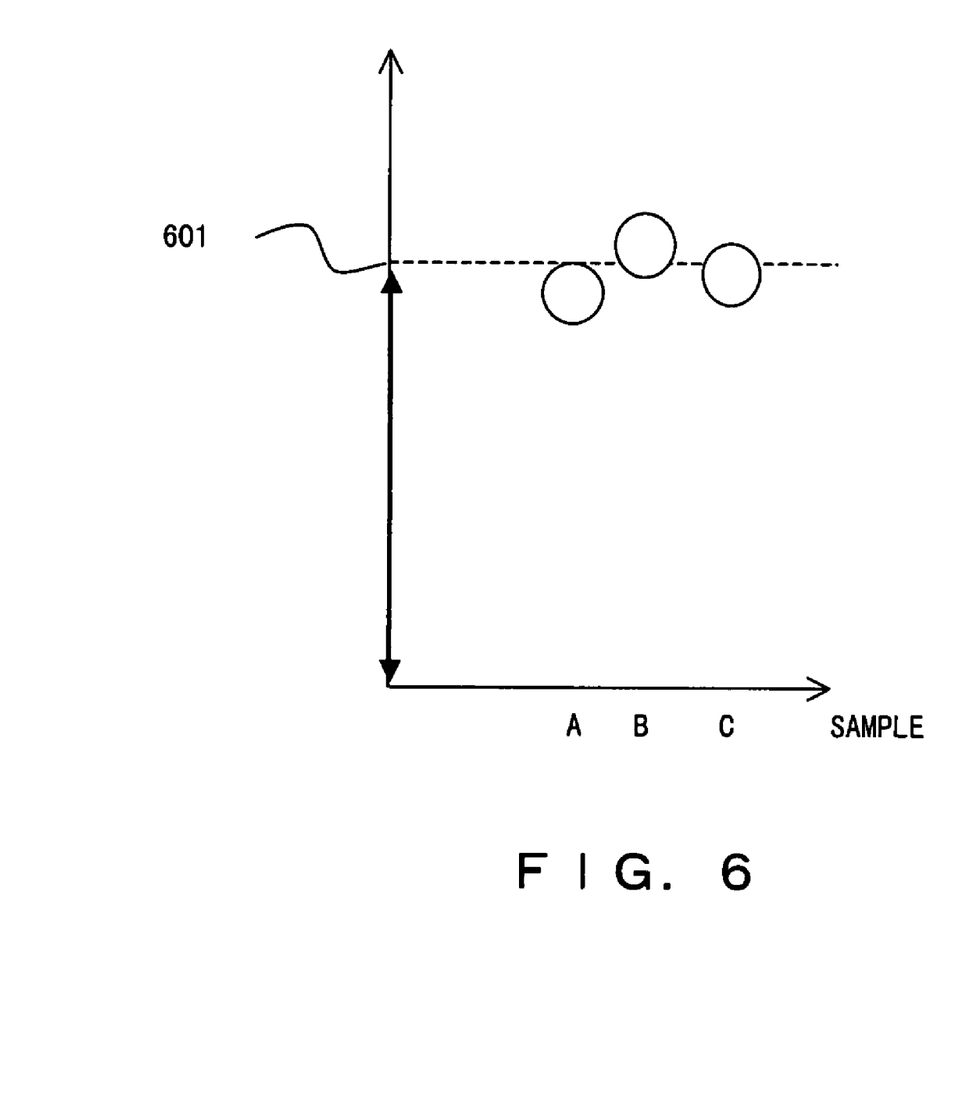
FIG. 6 shows measurement results of magnetic field intensity.

Regarding the magnetic field intensity, in the case of the magnetic field generator structure in FIG. 2, magnetic fields of different intensities are generated by each magnetic pole pair. The PC 304, for example, as shown in FIG. 6, by calculating the ratio of the measured intensity and the designed value of the magnetic field intensity for each magnetic field generator unit, and by obtaining the average 601, a characteristic number of the probe relating to the magnetic field intensity is calculated.

In the illustrated embodiment, three magnetic field generator units are operated using only one driving coil, however the invention is not limited to such a method. A similar effect can be obtained when a driving coil is incorporated into each magnetic field generator unit and generates arbitrary magnetic fields.

Additionally, scanning operation can be performed by moving the stage supporting a magnetic field generator device, instead of moving the cantilever 211.

When measuring a high frequency magnetic field of MHz order, it is known that measurement sensitivity is reduced by one order of magnitude compared with measurement of low-frequency magnetic fields of kHz order and direct-current magnetic fields. Therefore, as in the illustrated embodiment, it is important to drive the magnetic field generator units at the driving frequency actually employed during use of the magnetic field microscope. By so doing, accurate calibration of the absolute intensity of the probe can be achieved.

Figure 7:
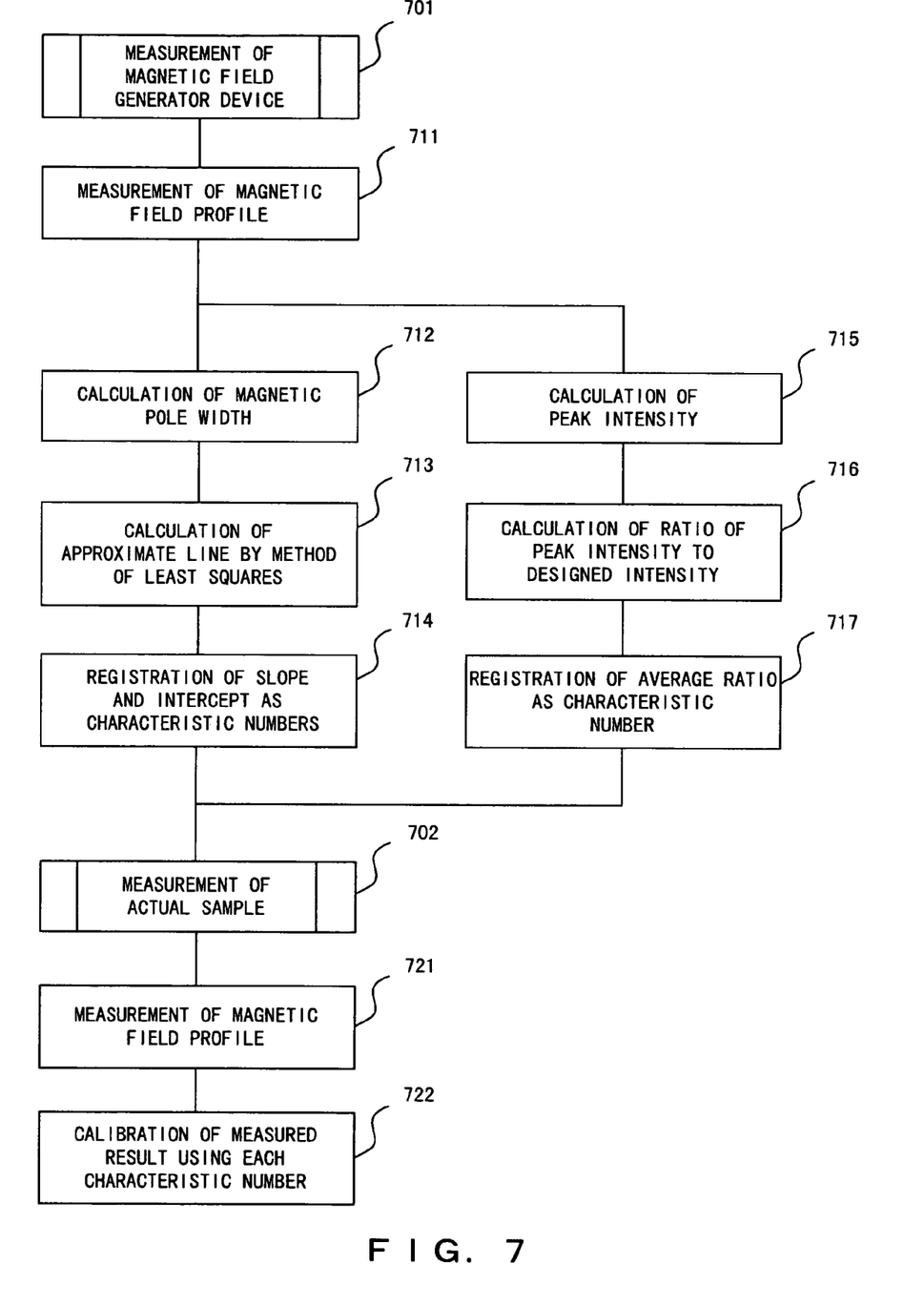
FIG. 7 is a flowchart of the calibration process.

FIG. 7 is a flowchart of the calibration process by the calibrator device in FIG. 3. The calibration process is divided into measurement of the magnetic field generator device 701 and measurement of the actual sample 702. In the measurement of the magnetic field generator device 701, first, the calibrator device obtains the line profile by scanning a plurality of magnetic generator units of the core 201 using the probe 212 (Step 711).

The PC 304, next, calculates the magnetic pole width of each magnetic field generator unit from the obtained line profile (Step 712), plots the calculated magnetic pole widths on the plane as in FIG. 5, and calculates the approximate line by the method of least squares (Step 713). The intercept α and the slope β of the line are registered in the memory as characteristic numbers of the line (Step 714).

The peak intensity of the magnetic field generated by each magnetic field generator unit is calculated from the line profile (Step 715), and the ratio of the peak intensity to the designed intensity is calculated (Step 716). The average γ of the ratios calculated for a plurality of magnetic field generator units is obtained and registered in the memory as a characteristic number of a probe (Step 717).

In the measurement of the sample 702, first, the calibrator device obtains the line profile by scanning over the sample using the probe 212 (Step 721).

Next, the measurement result is calibrated using each characteristic number stored in the memory (Step 722). Regarding the measurement distance of the sample, accurate distances can be obtained by subtracting the characteristic number α from the measured value, and similarly with regard to measured intensity, accurate intensities can be obtained by multiplying the measured value by the reciprocal of the characteristic number γ.

By measuring the magnetic field distribution with the magnetic field generator device driven at a high frequency, a characteristic number of the probe can be calculated and individual differences relating to the measured distance and intensity can be calibrated. By mounting the magnetic field generator device on the stage of the magnetic force microscope device and by calibrating as required (when the probe is changed, for example), it is possible to provide a magnetic force microscope device with assured absolute measurement. The calculation algorithms relating to the calibration are not limited to the ones shown in FIG. 5 and FIG. 6.

The magnetic field generator device can take various forms besides the one shown in FIG. 2. FIG. 8 through FIG. 11 shows some examples of alternative magnetic field generator configurations of magnetic field generator devices viewed from above.

Figure 8:
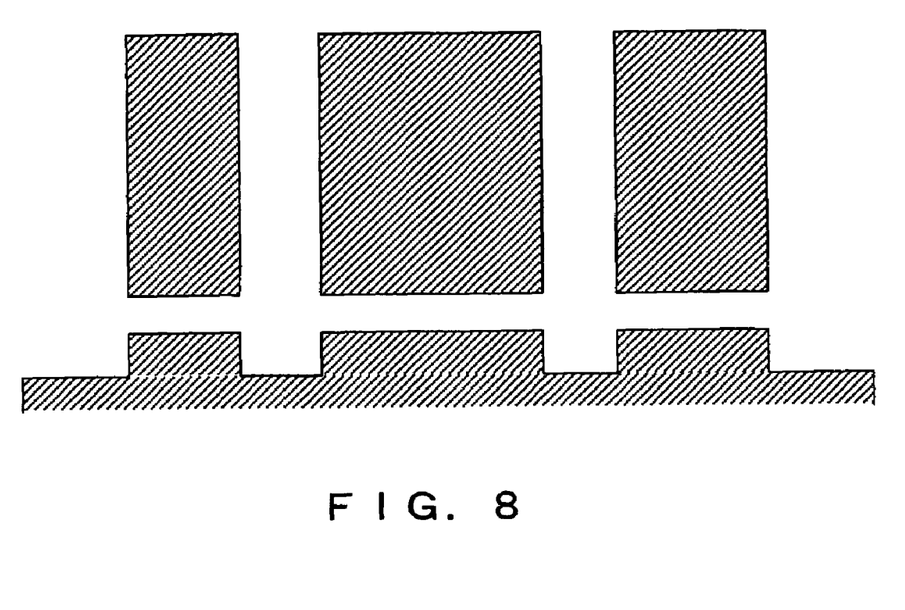
FIG. 8 describes a configuration of a second magnetic field generator device.
Figure 9:
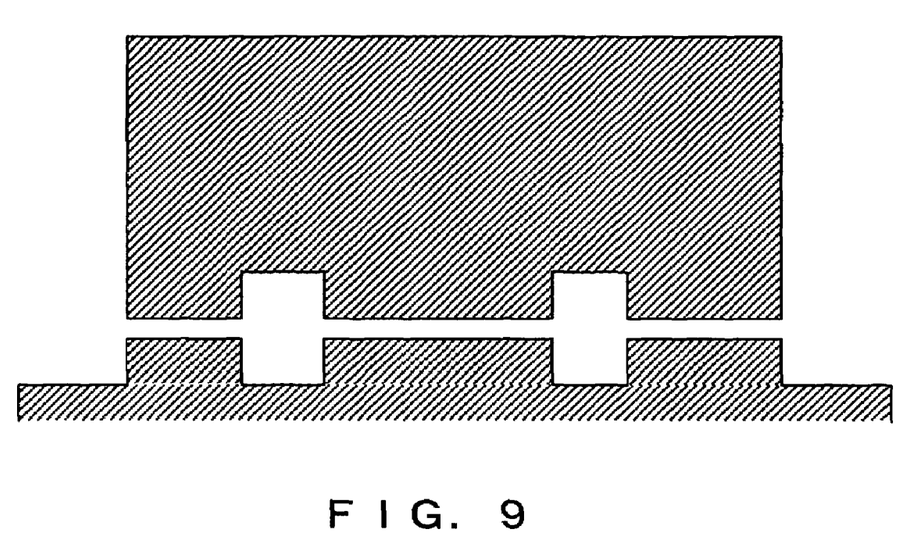
FIG. 9 describes a configuration of a third magnetic field generator device.

The magnetic field generator configuration in FIG. 8 is almost the same as the configuration described in FIG. 4, however poles on one side of a plurality of magnetic field generator units have an integrated form. The magnetic field generator configuration in FIG. 9 is also similar to the configuration described in FIG. 4, however poles on both sides of a plurality of magnetic field generator units have an integrated form. Using these magnetic field generator configurations, distinct magnetic fields are generated in separate locations, and thus a similar effect to that of the magnetic field generator device in FIG. 2 can be obtained.

Figure 10:
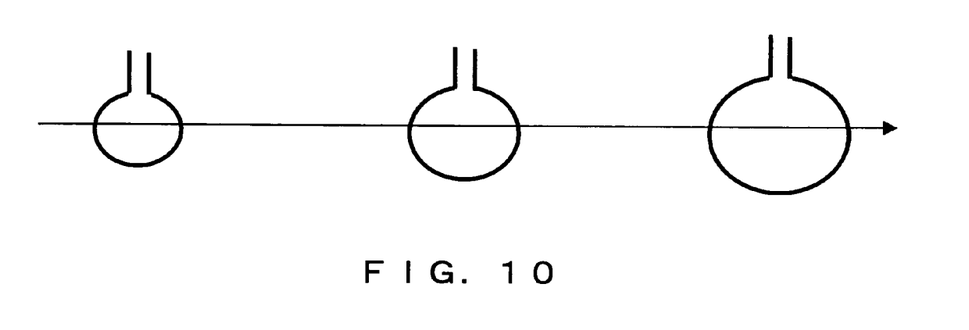
FIG. 10 describes a configuration of a fourth magnetic field generator device.

The magnetic field generator configuration in FIG. 10 is composed of a plurality of magnetic field generator units using a 1-turn coil configuration structure of a simple metal wire (loop conductor) without a magnetic pole structure. By forming different coil patterns of different size, shape and number of winds for each magnetic field generator unit, a similar effect to that of the one obtained by using the magnetic field generator device in FIG. 2 can be obtained.

Figure 11:
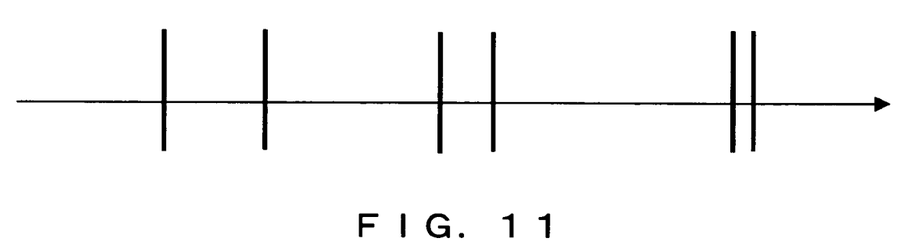
FIG. 11 describes a configuration of a fifth magnetic field generator device.

The magnetic field generator configuration in FIG. 11 is composed of a plurality of magnetic field generator units using a line and space structure of a simple metal wire (linear conductor) without a magnetic pole structure. By forming coil patterns of different size, shape of line and line and space for each magnetic field generator unit, a similar effect as the one obtained by using the magnetic field generator device of FIG. 2 can be obtained.

In the magnetic field generator device explained above, three magnetic field generator units are formed, however in general, an arbitrary number of two or more magnetic field generator units are formed. Where at least two of the magnetic field generator units have different external shapes, configurations, or sizes.

Figure 12:
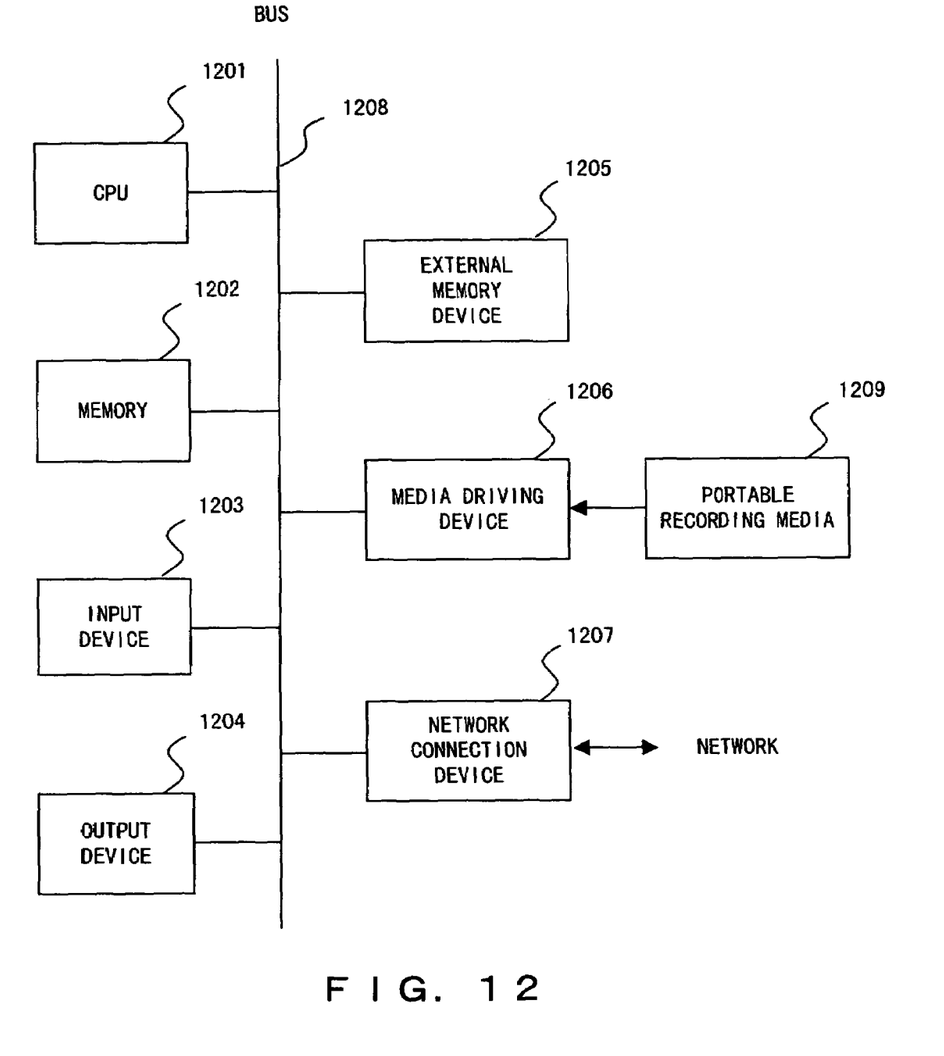
FIG. 12 shows a configuration of an information processor device.

FIG. 12 describes a configuration of an information processor device equivalent to the PC 304 in FIG. 3. The information processor device in FIG. 12 comprises a CPU (Central Processing Unit) 1201, memory 1202, an input device 1203, an output device 1204, an external memory device 1205, a media driver device 1206 and a network connection device 1207, and these devices are connected to each other by a bus 1208.

The memory 1202 refers to ROM (Read Only Memory), RAM (Random Access Memory), etc., and stores programs and data used for processing. The CPU 1201 performs the processes required to control and to calibrate a magnetic force microscope by executing a program utilizing the memory 1202.

The input device 1203 refers to a keyboard, a pointing device and a touch panel, for example, and is used for the input of data and commands from the operator. The output device 1204 refers to a display, a printer, speakers etc., and is used for output of results and for querying the operator.

The external memory device 1205 refers to magnetic disk devices, optical disk devices, magneto-optical disk devices, tape devices etc. The information processor device stores programs and data in the external memory device 1205, and uses them, as required, by loading them into the memory 1202.

The media driver device 1206 drives portable recording media 1209 and accesses the recorded contents. The portable recording media 1209 refers to a recoding media readable by an arbitrary computer such as memory cards, flexible disks, optical disks and magneto optical disks. The operator stores the programs and data in the portable recording media, and uses them, as required, by loading them into the memory 1202.

The network connection device 1207 is connected to a communication network such as a LAN (Local Area Network), and performs data conversion for communication.

The information processor device, receives programs and data from the external devices as required, via the network connection device 1207, and uses them by loading them into the memory 1202.

Figure 13:
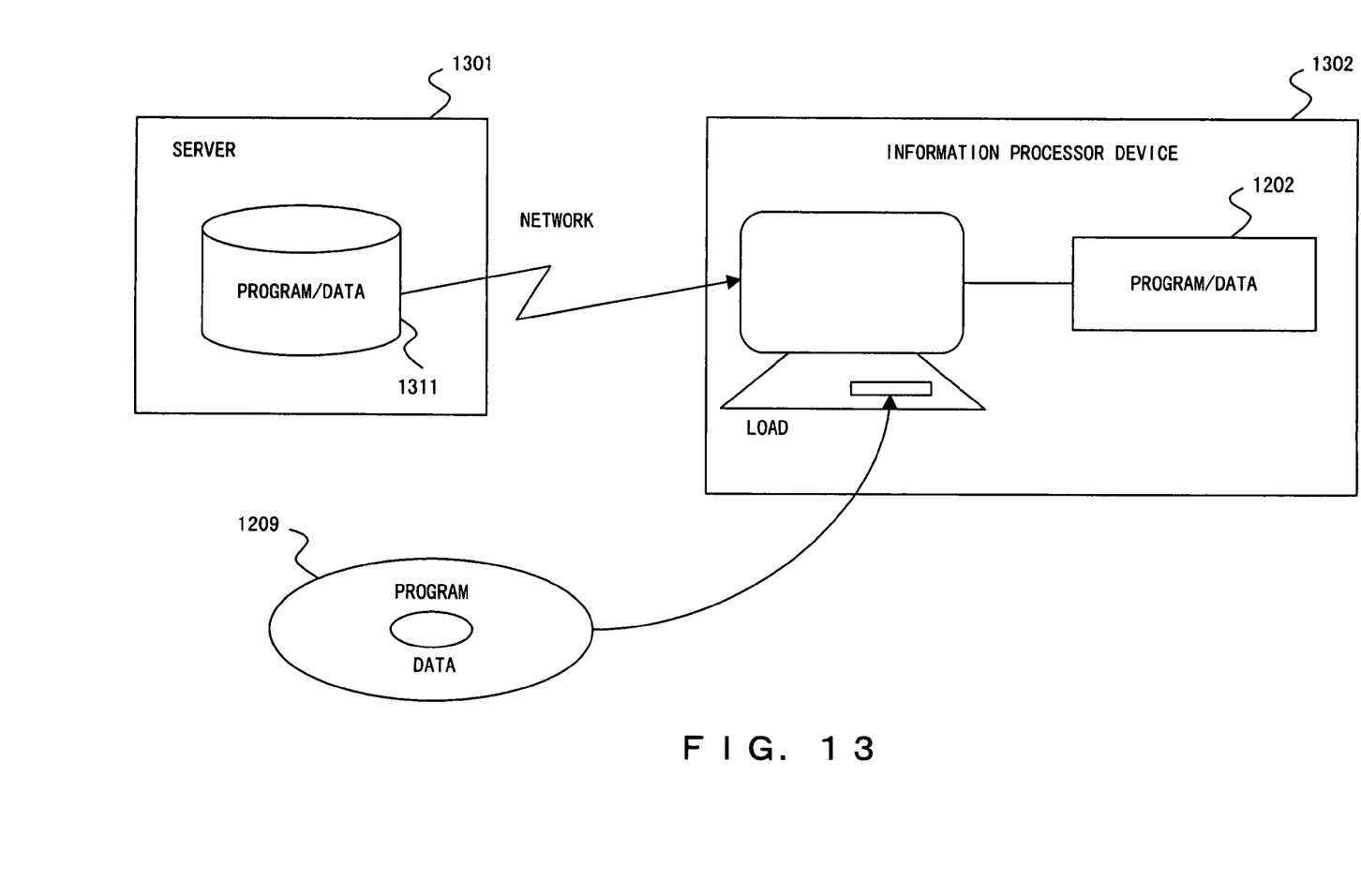
FIG. 13 illustrates a method to provide a program and data.

FIG. 13 describes a method to provide programs and data to the information processor device in FIG. 12. The programs and data stored in the portable recoding media 1209 and the database 1311 of a server 1301 are loaded into the memory 1202 of the information processor device 1302. The server 1301 generates a carrier signal for carrying the programs and data, and sends the signal to the information processor device 1302 through the transmission media of the network. The CPU 1201 executes the program using the data, and performs necessary processes.

What is claimed is:

1. A magnetic field generator device, which is used for calibration of a magnetic force microscope, comprising:
   a plurality of magnetic field generator units generating distinct magnetic fields in different locations, wherein at least two or more of a plurality of the magnetic field generator units are different in any one of external shape, configuration and size, and
   wherein a magnetic field distribution formed by the magnetic field generator units is scanned by the magnetic force microscope and the magnetic force microscope is calibrated using a scan result.

2. The magnetic field generator device according to claim 1, wherein at least two or more of a plurality of the magnetic field generator units can generate magnetic fields with different intensities.

3. The magnetic field generator device according to claim 1, wherein at least two or more of a plurality of the magnetic field generator units can generate arbitrary alternating-current magnetic fields.

4. The magnetic field generator device according to claim 1, wherein each of a plurality of the magnetic field generator units comprises a magnetic pole pair, which generates local magnetic fields.

5. The magnetic field generator device according to claim 1, wherein each of a plurality of the magnetic field generator units comprises loop conductors.

6. The magnetic field generator device according to claim 1, wherein each of a plurality of the magnetic field generator units comprises linear conductors.

7. A magnetic force microscope, comprising:
   a probe device, which scans a magnetic field distribution formed by a magnetic field generator device comprising magnetic field generator units, at least two or more of which have different external shape, configuration or size, generating distinct magnetic fields in different locations, and measures the intensity of the magnetic field distribution; and
   a processing device, which calibrates the probe device using the measurement result obtained by the scan.

8. A tangible computer-readable storage medium recording a program to direct a computer to execute the processes of:
   controlling a magnetic force microscope to scan a magnetic field distribution formed by a magnetic field generator device comprising magnetic field generator units, at least two or more of which have different external shape, configuration or size, generating distinct magnetic fields in different locations, and to measure the intensity of the magnetic field distribution; and
   calibrating a probe device of the magnetic force microscope using the measurement result obtained by the scan described above.

9. The tangible computer-readable storage medium according to claim 8, wherein the program directs the computer to execute the processes of:
   calculating the value of the measured size of a plurality of the magnetic field generator units from a line profile obtained as the measurement result;
   calculating a characteristic number of the probe device from the measured value and the designed value of the size of each of a plurality of the magnetic field generator units; and
   calibrating a measured distance, obtained from the sample measurement result, using the characteristic number.

* * * * *